(12) United States Patent
Gjorup

(10) Patent No.: US 9,424,134 B2
(45) Date of Patent: Aug. 23, 2016

(54) BOOT MANAGEMENT IN A NON-VOLATILE MEMORY SYSTEM

(71) Applicant: Intel Corporation, Santa Clara, CA (US)

(72) Inventor: Karsten Gjorup, Aalborg (DK)

(73) Assignee: Intel Corporation, Santa Clara, CA (US)

( * ) Notice: Subject to any disclaimer, the term of this patent is extended or adjusted under 35 U.S.C. 154(b) by 92 days.

(21) Appl. No.: 14/228,680

(22) Filed: Mar. 28, 2014

(65) Prior Publication Data

US 2015/0280749 A1 Oct. 1, 2015

(51) Int. Cl.
| | | |
|---|---|---|
| *G06F 11/14* | (2006.01) | |
| *H03M 13/35* | (2006.01) | |
| *G06F 11/10* | (2006.01) | |
| *H03M 13/11* | (2006.01) | |
| *H03M 13/37* | (2006.01) | |
| *G11C 29/00* | (2006.01) | |
| *G06F 12/02* | (2006.01) | |
| *H03M 13/00* | (2006.01) | |

(52) U.S. Cl.
CPC ....... *G06F 11/1417* (2013.01); *G06F 11/1008* (2013.01); *G06F 11/1012* (2013.01); *G06F 11/1048* (2013.01); *G06F 11/1068* (2013.01); *G06F 11/1072* (2013.01); *G06F 12/0246* (2013.01); *G11C 29/00* (2013.01); *H03M 13/1128* (2013.01); *H03M 13/35* (2013.01); *H03M 13/353* (2013.01); *H03M 13/3707* (2013.01); *H03M 13/3738* (2013.01); *H03M 13/3746* (2013.01); *H03M 13/6331* (2013.01)

(58) Field of Classification Search
CPC ........... G06F 11/1012; G06F 11/1068; G06F 12/0246; G06F 11/1008; G06F 11/1048; G06F 11/1072; G06F 11/1417; G06F 2212/2022; G06F 9/4401; G06F 9/4408; H03M 13/1128; H03M 13/3707; H03M 13/35; H03M 13/3738; H03M 13/3746; H03M 13/6331; G11C 29/00; G11C 11/4072; G11C 2211/5641; G11C 7/20
USPC ....... 714/755, 780, 752, 758, 764, 768, 773; 365/185.11
See application file for complete search history.

(56) References Cited

U.S. PATENT DOCUMENTS

| | | | | |
|---|---|---|---|---|
| 5,388,267 | A * | 2/1995 | Chan | G06F 9/4403 713/2 |
| 5,450,576 | A * | 9/1995 | Kennedy | G06F 9/4405 709/222 |
| 6,415,371 | B1 * | 7/2002 | Nakamura | G11B 19/122 711/152 |
| 7,970,984 | B2 * | 6/2011 | Lasser | G06F 9/4403 711/103 |
| 8,312,354 | B1 * | 11/2012 | Varnica | H03M 11/1105 714/780 |
| 2002/0024616 | A1 * | 2/2002 | Kim | G06F 9/4401 348/714 |
| 2002/0144052 | A1 * | 10/2002 | Yada | G06F 8/60 711/103 |
| 2006/0041711 | A1 * | 2/2006 | Miura | G11C 11/4072 711/103 |
| 2006/0075395 | A1 * | 4/2006 | Lee | G11C 16/102 717/168 |

(Continued)

*Primary Examiner* — John J Tabone, Jr.
(74) *Attorney, Agent, or Firm* — Chapin, IP Law, LLC

(57) ABSTRACT

According to one configuration, computer processor hardware retrieves boot data stored in the non-volatile memory system. The boot data includes executable boot code and corresponding error correction information. The computer processor hardware applies first error correction decoding to the retrieved boot data. In response to detecting an inability to decode the retrieved boot data via application of the first error correction decoding, the computer processor hardware applies second error correction decoding to the retrieved boot data to configure the computer processor hardware.

23 Claims, 8 Drawing Sheets

(56) References Cited

U.S. PATENT DOCUMENTS

| | | | |
|---|---|---|---|
| 2006/0107071 A1* | 5/2006 | Girish | G06F 11/1433 713/191 |
| 2008/0008001 A1* | 1/2008 | Kuroyanagi | G06F 11/1068 365/185.11 |
| 2009/0044077 A1* | 2/2009 | Choi | G11B 20/00086 714/764 |
| 2009/0177931 A1* | 7/2009 | Song | G06F 11/1012 714/704 |
| 2011/0246858 A1* | 10/2011 | Aoyagi | G06F 11/1008 714/768 |
| 2012/0240007 A1* | 9/2012 | Barndt | H03M 13/1108 714/758 |
| 2012/0303942 A1* | 11/2012 | Peacock | G06F 12/0875 713/2 |
| 2013/0132653 A1* | 5/2013 | Post | G06F 3/0644 711/103 |
| 2013/0173985 A1* | 7/2013 | Chung | H03M 13/1111 714/755 |
| 2014/0019741 A1* | 1/2014 | Nautiyal | G06F 9/4408 713/2 |
| 2014/0146872 A1* | 5/2014 | Du | H04N 19/423 375/240.2 |
| 2014/0245098 A1* | 8/2014 | Sharon | G06F 11/1012 714/755 |
| 2014/0250295 A1* | 9/2014 | Briden | G06F 12/0246 713/2 |
| 2014/0289584 A1* | 9/2014 | Chilappagari | G06F 11/1068 714/755 |
| 2015/0106548 A1* | 4/2015 | Dubois | G06F 3/0619 711/103 |
| 2015/0220389 A1* | 8/2015 | Kim | G06F 11/1048 714/764 |

* cited by examiner

BOOT MANAGEMENT IN A NON-VOLATILE MEMORY SYSTEM

BACKGROUND

Computing devices such as cellular phones, smart phones, laptops, tablets, etc., have become popular in recent years. As with most conventional computing devices, there is a need to provide storage of programs, data, etc., when the computing device is powered down. In addition to retaining data when it is depowered, conventional non-volatile memory lends itself to use in such applications due to its small size and ability to survive physical agitation as a result of a respective computing device being dropped. Boot programs have long been used to initialize a corresponding computer device after it has been powered. In general, a boot program is code executed by a respective computer after power is applied to a corresponding CPU (Computer Processing Unit). The executed boot code computer program typically loads a main operating system into memory space so that the corresponding computer device can thereafter be used to execute one or more different applications as desired by a respective user of the computer system.

It is common to store boot code in a pre-specified location of respective non-volatile memory in a computer device. Upon power up of the computer device (such as when a computer is first turned ON is re-energized after being turned off, when the computer is reset or when the operator invokes an appropriate LOAD function from a respective console, etc.), a respective processor resource retrieves the boot code from a non-volatile memory storage resource (such as a NAND flash devices) and then executes the retrieved boot code. In certain instances, as mentioned, execution of the boot code (as retrieved from non-volatile memory) causes the computer to perform an initial operation such as loading of an operating system. The code retrieved by the executed boot program (such as code of the operating system) can be stored in another storage location such as in a hard disk drive (separate from the non-volatile memory that stores the boot code).

Non-volatile memory, for example, NAND flash memory (in which executable boot code is stored) may include many storage cells to store bits of information. Any of the many storage cells can fail over the useful life of the memory system. One conventional way to reduce the impact of failing memory cells and loss of data is to generate and store error correction information for corresponding data to be stored in a memory system. In certain instances, the error correction information can be used to restore corrupted data, which is caused by one or more failing memory cells.

To ensure a long life of a respective computer device, and provide a continued ability to boot a respective communication device despite loss of data due to memory cell failures, boot code stored in a respective non-volatile memory device is typically stored along with corresponding error correction information. The error correction information enables a respective error correction decoder to correct bit errors associated with retrieved boot code prior to execution of the boot code by a respective processor resource to boot the computer device.

BRIEF DESCRIPTION OF THE DRAWINGS

The accompanying drawings, which are incorporated in and constitute a part of this specification, illustrate one or more embodiments described herein and, together with the Detailed Description, explain these embodiments.

DESCRIPTION OF THE EMBODIMENTS

Figure 1:
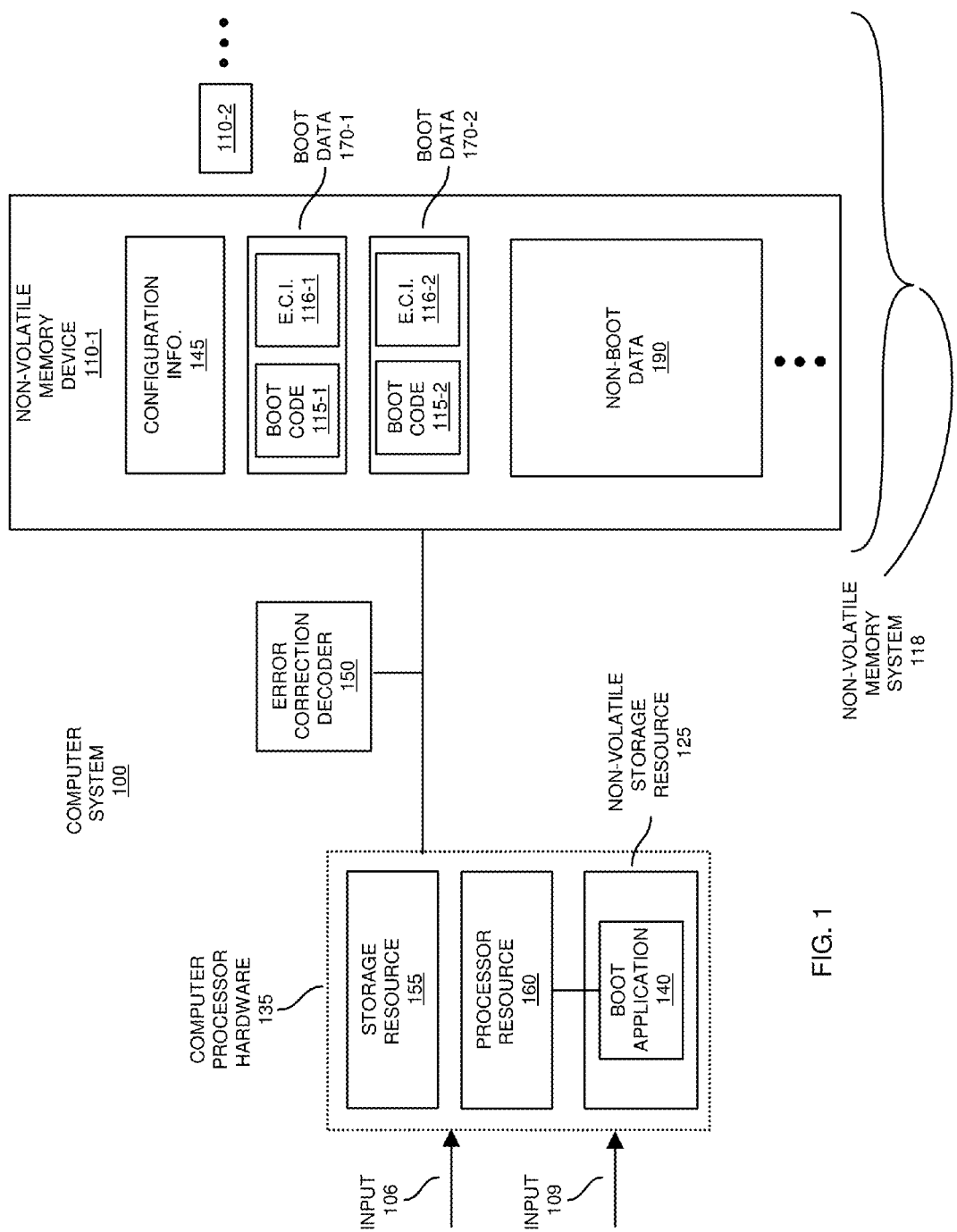
FIG. 1 is an example diagram illustrating computer resources and booting of a computer system according to embodiments herein.

Mobile phones and other standalone devices have employed NAND flash memory to store a respective boot program. In such instances, a processor attempts to retrieve and execute the boot code following a condition such as power-up of the computer device. The boot code and corresponding error correction information is typically stored in a pre-specified location in the NAND flash memory. A typical NAND flash consists of a plurality of blocks; each block includes multiple pages of storage cells. Each page is divided into main area (for storage of a data payload) and spare area (to store data such as error correction information).

As an example, main area (data payload actually used by the processor to execute a respective application) of a page may be 2048 bytes and spare area may be 64 bytes. The extra area (spare area) is meant for software book keeping and storage of error correction information. As previously discussed, the error correction information may be needed since a NAND flash can be prone to bit errors upon retrieval of respective data. In other words, the error correction information ensures that executable boot code stored in the NAND flash can be obtained for execution and booting (configuring) of the respective computer device even if one or more storage cells fails to properly store the data.

Early in the evolution of ECC (Error Correction Code) memory, a requirement was that the ECC system should be able to correct 1 bit per 528 bytes. That was typically done in dedicated hardware on the host processor to ensure acceptable read and write speed. However, modern requirements to error correction decoding have become higher as the production technology has become smaller. Today, typical error correction decoding requirements dictate error correction of between 4-bit error correction per 528 bytes and 8-bit error correction per 528 bytes.

In general, geometries for storing data in flash devices can vary. This is partly due to the fact that geometries of storing data have changed over time. For example, a first flash device may support a page size of 2048 bytes. A second flash device may support a page size of 4096 bytes. The spare area associated with a respective page may vary. Because there are so many different flash geometries (page size, spare area size, etc.), when storing boot code and corresponding error correction information, a data partitioning format of storing such information may vary. For example, a respective page of non-volatile memory can be apportioned in any suitable manner to store one or more portions of boot code and one or more portions of error correction information.

In order to retrieve boot code from data stored in multiple pages of a respective non-volatile memory device, it is necessary to know the data-partitioning format that was originally used to store the boot code and corresponding error correction information in the respective storage device. As further discussed below, the data-partitioning format indicates which segments of data in a respective page represent boot code in which segments of data in the respective page represent error correction information.

One way to determine the data partitioning format that was used to store corresponding boot data stored in a non-volatile memory device is to, if available, retrieve configuration information from the non-volatile memory device. The configuration information can include codes indicating the size of the main area, spare area, etc., associated with each respective page. In certain instances, such as when the configuration information specifies a size of the spare area and pages size, it is possible to use the configuration information to derive a data-partitioning format that was originally used to store corresponding boot data.

However, one problem with attempting to determine the data-partitioning format that was originally used to store corresponding boot data is that certain memory vendors do not specify the spare area size and/or main area size for each page using respective codes. Another problem with attempting to determine the data-partitioning format that was originally used to store corresponding data is that respective codes in the configuration information are not able to specify all the different geometries that are available in the NAND flash market today. Thus, during an attempt to boot (configure) a corresponding computer device, if the processor resource is unable to correctly identify original partitioning of boot code and corresponding error correction information stored in the respective memory device, the processor resource will not be able to extract the boot code from the retrieved boot data and properly configure a respective computer device.

In contrast to conventional methods, embodiments herein enable a respective processor resource to configure a respective computer device even if it is not possible for the processor resource to use configuration information in a respective non-volatile memory device to determine the original data-partitioning format associated with storage of boot data in the non-volatile memory device.

More specifically, embodiments herein include computer processor hardware and a non-volatile memory system to store boot data. The boot data can include boot code and corresponding error correction information that is available to correct errors in the boot code in the event that one or more storage cells storing the boot code becomes corrupted (e.g., a storage cell changes from a logic one to a logic zero due to a storage cell failure or vice versa).

Assume that the computer processor hardware retrieves boot data stored in the non-volatile memory system. The computer processor hardware applies a first error correction decoding to the retrieved boot data to correct errors in the boot code. In one embodiment, the computer processor hardware retrieves configuration information from the non-volatile memory system to derive a respective data-partitioning format to perform the first error correction decoding. As its name suggests, the derived data-partitioning format specifies which segments in a page of the retrieved boot data represent boot code and which portion represent error correction information. As previously discussed, if the data-partitioning format used to retrieve data is incorrect (i.e., not the same as the data-partitioning format used to originally store the boot data), the first error correction decoding will not be able to properly extract the boot code from the boot data.

Assume in this example embodiment that a first data-partitioning format used in the first decoding cannot be used to decode the boot data because the boot data was originally stored in the non-volatile memory system in accordance with a different data-partitioning format. In response to detecting an inability to decode the retrieved boot data via application of the first error correction decoding, the computer processor hardware applies second error correction decoding (such as backup or default error correction decoding) to the retrieved boot data to configure the computer processor hardware.

In one embodiment, the computer processor hardware identifies the (second) default data-partitioning format based on setting information stored in a storage resource disparately located with respect to the non-volatile memory system that stores the boot data. In other words, the computer processor hardware does not need to access configuration information stored in a respective non-volatile memory device that stores the boot code to determine the default data-partitioning format.

Application of the default error correction decoding ensures that the computer device can be booted properly in cases in which the boot data is stored in accordance with a default data-partitioning format as opposed to a format as specified by configuration information stored in the non-volatile memory system. In one embodiment, storage of boot data (boot code and error correction information) in accordance with a data-partitioning format enables computer processor hardware to boot (or be configured) regardless of the type of memory device.

By way of non-limiting example, in one embodiment, the default data-partitioning format chosen to store boot data is 1024+128 bytes of data (such as 1024 bytes for a data payload and 128 bytes spare) even though a respective memory device may support a much larger page size such as 4096+ bytes. Using a low percentage such as around 25% of available storage cells in a respective page to store boot code may result in low usage efficiency. However, only a small portion of storage cells such as a block of pages may be needed to store respective boot code.

Now, more specifically, FIG. 1 is an example diagram illustrating booting of a computer system according to embodiments herein.

As shown, computer system 100 includes computer processor hardware 135, error correction decoder 150, non-volatile memory system 118, etc.

The computer processor hardware 135 includes storage resource 155, processor resource 160, and non-volatile storage resource 125. By way of non-limiting example, computer processor hardware 135 can be a single computer chip or die including circuitry such as non-volatile storage resource 125, storage resource 155, and processor resource 160. In such an instance, storage resource 155 and non-volatile storage resource 125 represent on-chip storage resources.

In accordance with alternative embodiments, note that computer processor hardware 135 can be a circuit in which storage resource 155, processor resource 160, and non-volatile storage resource 125 are discrete components.

As shown, non-volatile storage resource 125 stores boot application 140. As its name suggests, and as further discussed below, the application 140 supports booting of computer system 100.

Non-volatile memory system 118 includes one or more non-volatile memory devices 110-1, 110-2, etc. In the example embodiment shown, memory device stores configuration information 145, boot data 170-1, boot data 170-2, non-boot data 190, etc.

By way of a non-limiting example, each of the non-volatile memory devices 110-1, 110-2, etc., in non-volatile memory system 118 can be any suitable type of resource. For example, the non-volatile memory devices 110 can be any type of non-volatile memory that stores data such, Phase Change Memory (PCM), a three dimensional cross point memory, a resistive memory, nanowire memory, Ferroelectric Transistor Random Access Memory (FeTRAM), flash memory such as NAND or NOR, Magnetoresistive Random Access Memory (MRAM) memory that incorporates memristor technology, Spin Transfer Torque (STT)-MRAM, etc.

Certain data (such as the boot data 170-1, boot data 170-2, non-boot data 190, . . . ) stored in non-volatile memory 110-1 can be stored in respective arrays of storage cells along with corresponding error correction information (such as error correction codes). Configuration information 145 may be hard-coded in respective circuits separate from the arrays of storage cell in non-volatile memory device 110-1 and may not include corresponding correction information.

In one embodiment, if present in a respective non-volatile memory device, configuration information 145 indicates physical attributes such as page size, block size, redundant area size, organization, etc., associated with non-volatile memory device 110-1.

As previously discussed, storage cells associated with non-volatile memory device 110-1 are susceptible to corruption. That is, the data stored in one or more storage cells of non-volatile memory device 110-1 may be read back as a logic one even though it was programmed to be a logic zero or read back as a logic zero even though it was programmed to be a logic one.

Computer system 100 includes error correction decoder 150 to correct data retrieved from a respective non-volatile memory device in non-volatile memory system 118. As previously mentioned, data stored in arrays of non-volatile memory device 110-1 can include corresponding error correction information to correct one or more failing storage cells.

Assume in this example embodiment that computer system 100 is initially unpowered. In such an instance non-volatile memory device 110-1 continues to store respective boot data 170, non-boot data, etc., and retain configuration information 145 even though the respective non-volatile memory devices are unpowered.

Subsequent to application of power to computer system 100 and respective components such as computer processor hardware 135, error correction decoder 150, non-volatile memory system 118, etc., the computer processor hardware 135 receives input 106 (such as a processor boot signal) indicating to configure the computer system 100. In response to receiving input 106, the processor resource 160 initiates execution of boot application 140 stored in non-volatile storage resource 125.

In one non-limiting example embodiment, boot application 140 supports configuring of different types of non-volatile memory systems. The computer processor hardware 135 receives input 109 indicating the type of memory system (such as flash, disk, etc.) installed in computer system 100.

By way of non-limiting example, input 109 can be one or more input pins that are pulled up or down on a respective circuit board on which computer processor hardware 135 resides. Depending on the type of resource specified by input 109, the processor resource 160 initiates execution of a corresponding portion of boot application 140 to configure the computer system 100.

In furtherance of booting or configuring computer system 100 and corresponding computer processor hardware 135, the processor resource 160 executes boot application 140. In one embodiment, execution of the boot application 140 stored in non-volatile storage resource 125 (such as read only memory) causes processor resource 160 to communicate with non-volatile memory device 110-1 to retrieve configuration information 145 stored in non-volatile memory device 110-1. The processor resource 160 processes the configuration information 145 to identify (or derive) a first data-partitioning format indicative of how corresponding boot data 170-1 is stored in non-volatile memory device 110-1. This is more particularly shown in FIG. 2. As previously discussed, certain vendors to not provide a sufficient amount of configuration enabling the respective processor resource 160 to specifically identify which segments of a respective page store boot code 115-1 or which segments of a respective page store error correction information 116-1.

Figure 2:
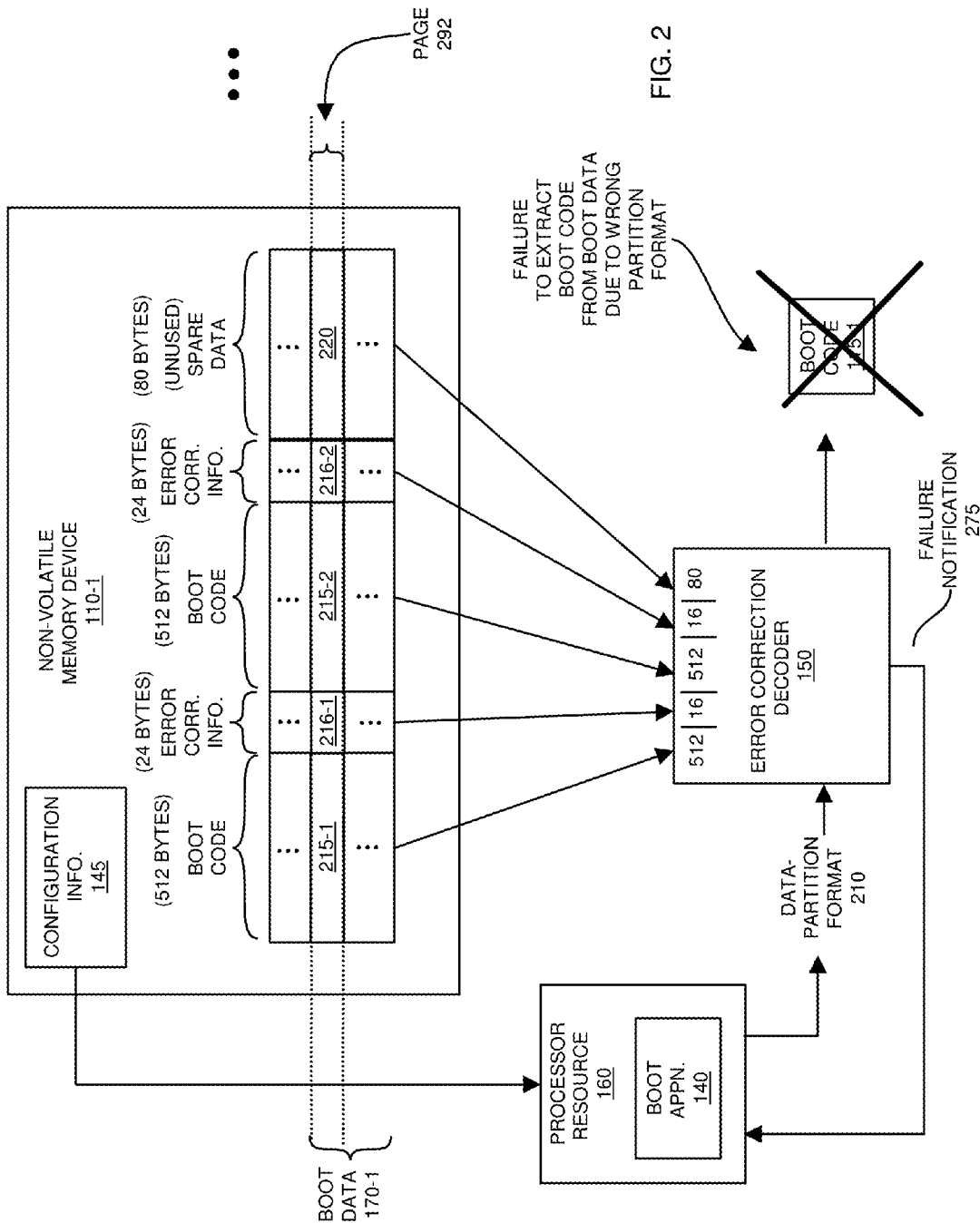
FIG. 2 is an example diagram illustrating error correction decoding using a first data-partitioning format according to embodiments herein.

As further shown in FIG. 2, processor resource 160 derives data-partitioning format 210 based on configuration information 145 retrieved from non-volatile memory device 110-1. If the data partition format 210 does not precisely match the original partitioning of corresponding boot data 170-1 in non-volatile memory device 110-1, the error correction decoder 150 will not be able to extract corresponding boot code 115-1 from boot data 170-1. In other words, assume that the boot code 115-1 (which includes multiple pages of data stored in non-volatile memory device 110-1) is stored in accordance with a data-partitioning format of: 512 bytes/24 bytes/512 bytes/24 bytes/80 bytes as shown in FIG. 2.

As further shown in FIG. 2, page 292 of boot data 170-1 includes two segments of boot code (such as segment 215-1 and segment 215-2) and two segments of error correction information (such as segment 216-1 and segment 216-2). More specifically, segment 215-1 includes 512 bytes of a boot code; segment 216-1 includes 24 bytes of error correction information; segment 215-2 includes 512 bytes of boot code; segment 216-2 includes 24 bytes of error correction information; segment 220 includes 80 spare bytes.

Assume in this example embodiment that data-partitioning format 210 specifies a different partitioning format than the format used to store respective boot data 170-1. For example, assume that the data-partitioning format 210 as generated by the processor resource 160 indicates a format of (512 bytes/16 bytes/512 bytes/16 bytes/80 bytes) based on configuration information 145.

Processor resource 160 initiates retrieval of data stored in page 292 of non-volatile memory device 110-1. Because the data partitioning format 210 does not match the original data partitioning format that was used to store the respective boot code 115-1 and corresponding error correction information 116-1 in non-volatile memory device 110-1, the error correction decoder 150 detects an error when trying to extract or reproduce a corrected version of boot code 115-1 from boot data 170-1. In this instance, error correction decoder 150 generates a corresponding failure notification 275 to inform processor resource 160 (executing boot application 140) of the failure.

Thus, embodiments herein can include: retrieving boot data 170-1 stored in a non-volatile memory device 110-1 to configure computer processor hardware 135; apply first error correction decoding (using the data-partitioning format 210) to the retrieved boot data 170-1; initiating decoding of the retrieved boot data 170-1 in accordance with the data-partitioning format 210; and detecting an inability to decode the retrieved boot data 170-1 via application of the data-partitioning format 210.

In one embodiment, as mentioned, the error correction decoder 150 generates the failure notification 275 in response to detecting a number of errors associated with first error correction decoding above a threshold value.

Figure 3:
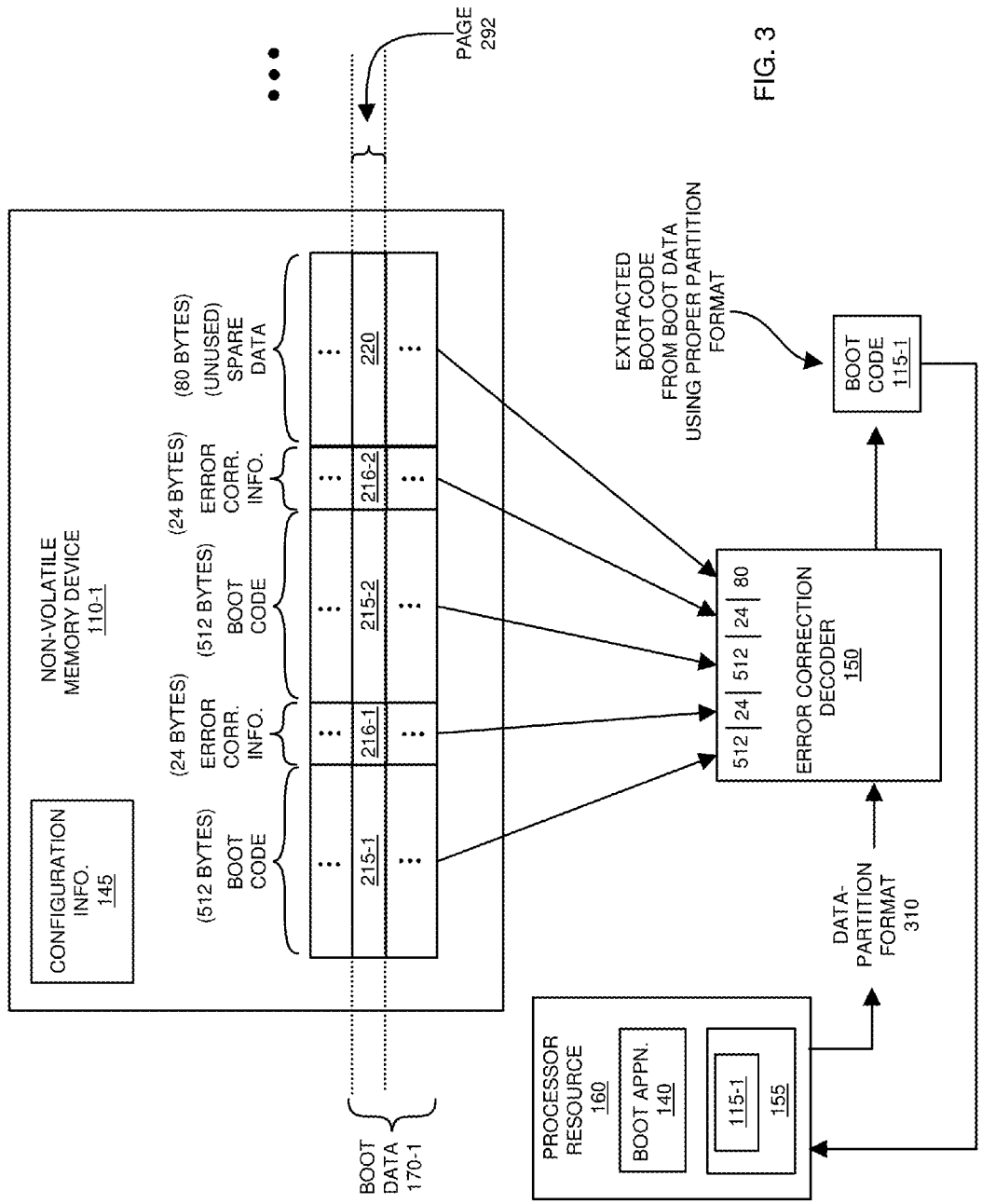
FIG. 3 is an example diagram illustrating error correction decoding using a second data-partitioning format according to embodiments herein.

In response to detecting an inability to decode the retrieved boot data 170-1 via application of the first error correction decoding (data-partitioning format 210), as shown in FIG. 3, the processor resource 160 executing boot application 140 applies second error correction decoding to the boot data 170-1 to configure the computer processor hardware 135 as further discussed below.

FIG. 3 is an example diagram illustrating error correction decoding using a second error correction partition format according to embodiments herein.

Instead of using configuration information 145 to derive a corresponding data partitioning format, in accordance with instructions in the boot application 140, the processor resource 160 initiates retrieval and subsequent error checking of the boot data 170-1 using a default data-partitioning format 310.

In one embodiment, the settings associated with the default data-partitioning format 310 can be stored in any suitable location such as in boot application 140, error correction decoder 150, etc. For example, the boot application 140 can specify attributes of the data partitioning format 310 (such as 512/24/512/24/80) that is to be used by error correction decoder 150 to decode the corresponding boot data 170-1; the error correction decoder 150 can be configured to store settings associated with the default data partitioning format 310, a command generated by the boot application 140 to the error correction decoder 150 can initiate decoding using the default data partitioning format 310; and so on.

Assume in this example embodiment that processor resource 160 initiates retrieval and application of error correction to boot data 170-1 stored in non-volatile memory device 110-1 in accordance with data partitioning format 310 (512/24/512/24/80). This is the same data-partitioning format that was used to originally store the boot data 170-1 in the non-volatile memory device 110-1.

The error correction decoder 150 utilizes the specified data-partitioning format 310 to partition and decode the retrieved boot data 170-1 to identify boot code 115-1. In one embodiment, subsequent to proper error correction decoding, the processor resource 160 initiates storage of the boot code 115-1 in storage resource 155.

The processor resource 160 executes the boot code 115-1 stored in storage resource 155 to further boot or configure the computer system 100. For example, via execution of boot code 155, the processor resource 160 identifies a data-partitioning format that was used to store boot data 170-2 (including boot code 115-2 and corresponding error correction information 116-2) stored in non-volatile memory device 110-1. The processor resource 160 utilizes the partition format identified by the boot code 115-1 to retrieve and decode the boot code 115-2 stored in the non-volatile memory system 118. Thereafter, the processor resource 160 executes the boot code 115-2 to further configure the computer processor hardware.

In one embodiment, the 24 bytes (segment 216-1) of error correction information for corresponding 512 bytes (segment 215-1) of boot code enables up to 16 bits of error correction for the respective 512 bytes.

Figure 4:
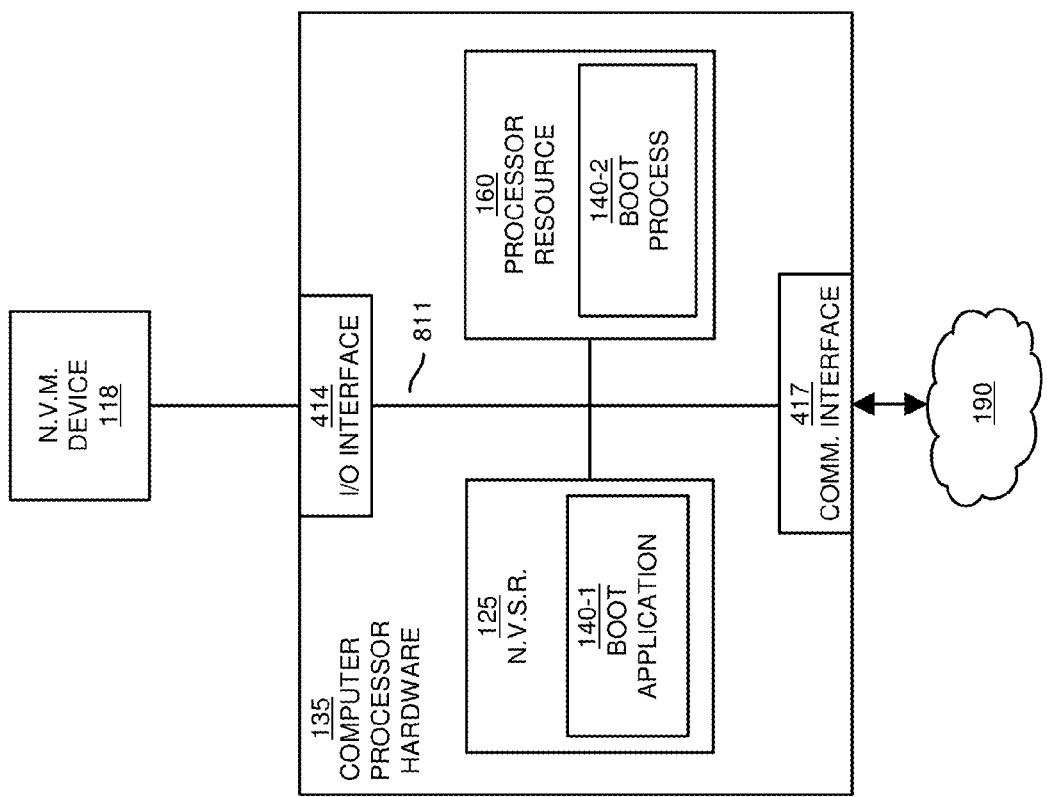
FIG. 4 is an example diagram illustrating computer processor hardware in which to execute one or more methods according to embodiments herein.

FIG. 4 is an example block diagram of computer processor hardware to implement any of the operations as discussed herein according to embodiments herein.

Computer processor hardware 135 can be configured to execute any of the operations as discussed herein. In one embodiment, computer processor hardware 135 executes boot application 140-1 to configure respective computer processor hardware 135.

As further shown, computer processor hardware 135 of the present example can include an interconnect 411 that couples non-volatile storage resource 125 (such as computer readable storage media) to computer processor resource 160 such as processor hardware. Non-volatile storage resource 125 can be a non-transitory type of media (i.e., any type of hardware storage medium) in which digital information is stored and retrieved by resources such as processor resource 160 (i.e., one or more processor devices), I/O interface 414, communications interface 417, etc.

Communication interface 417 provides connectivity with network 190 facilitating communication with other resources. I/O interface 414 provides the computer processor hardware 135 connectivity to one or more resources such as non-volatile memory system 118.

Non-volatile storage resource 125 can be any hardware storage device such as memory, optical storage, hard drive, floppy disk, etc. In one embodiment, the non-volatile storage resource 125 (e.g., a computer readable hardware storage) stores instructions and/or data (such as boot application 140-1).

As shown, non-volatile storage resource 125 is encoded with boot application 140-1 (e.g., software, firmware, etc.) executed by processor resource 160. Boot application 140-1 can be configured to include instructions and/or data to implement any of the operations as discussed herein.

During operation of one embodiment, processor resource 160 accesses computer non-volatile storage resource 125 via the use of interconnect 411 in order to launch, run, execute, interpret or otherwise perform the instructions in boot application 140-1 stored in non-volatile storage resource 125.

Execution of the boot application 140-1 produces processing functionality such as boot process 140-2 in processor resource 813. In other words, the boot process 140-2 associated with processor resource 160 represents one or more aspects of executing boot application 140-1 within or upon the processor resource 160 in the computer processor hardware 135.

In accordance with different embodiments, note that computer processor hardware 135 (or computer system 100) may be or included in any of various types of devices, including, but not limited to, a mobile computer, a mobile phone device, a personal computer system, a wireless device, base station, phone device, desktop computer, laptop, notebook, netbook computer, mainframe computer system, handheld computer, workstation, network computer, application server, storage device, a consumer electronics device such as a camera, camcorder, set top box, mobile device, video game console, handheld video game device, a peripheral device such as a switch, modem, router, or in general any type of computing or electronic device.

Functionality supported by the different resources will now be discussed via flowcharts in FIGS. 5-7. Note that where appropriate, the processing in the flowcharts below can be executed in any suitable order.

Figure 5:
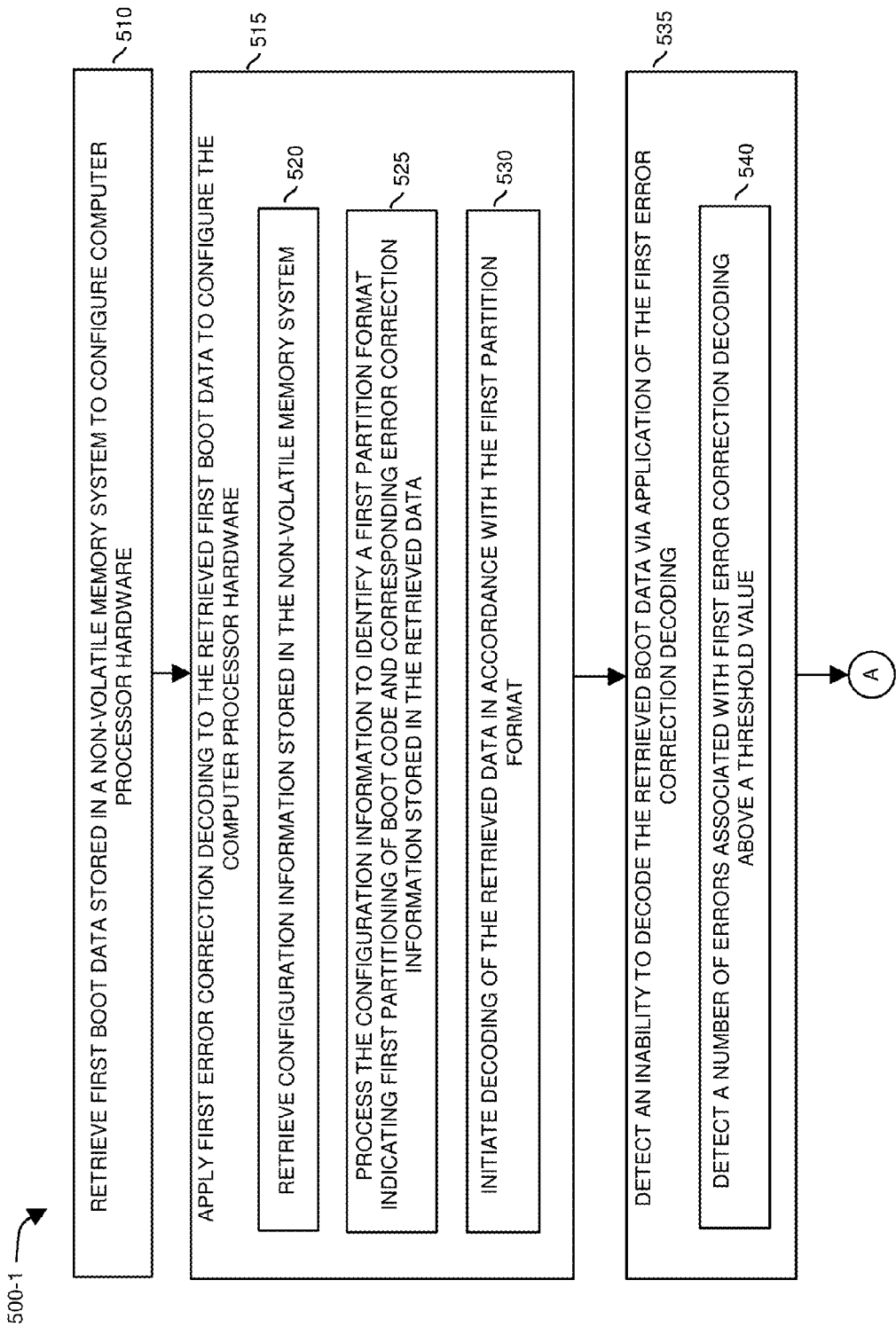
FIGS. 5 and 6 combine to an example flowchart illustrating a method of configuring computer processor hardware according to embodiments herein.
Figure 6:
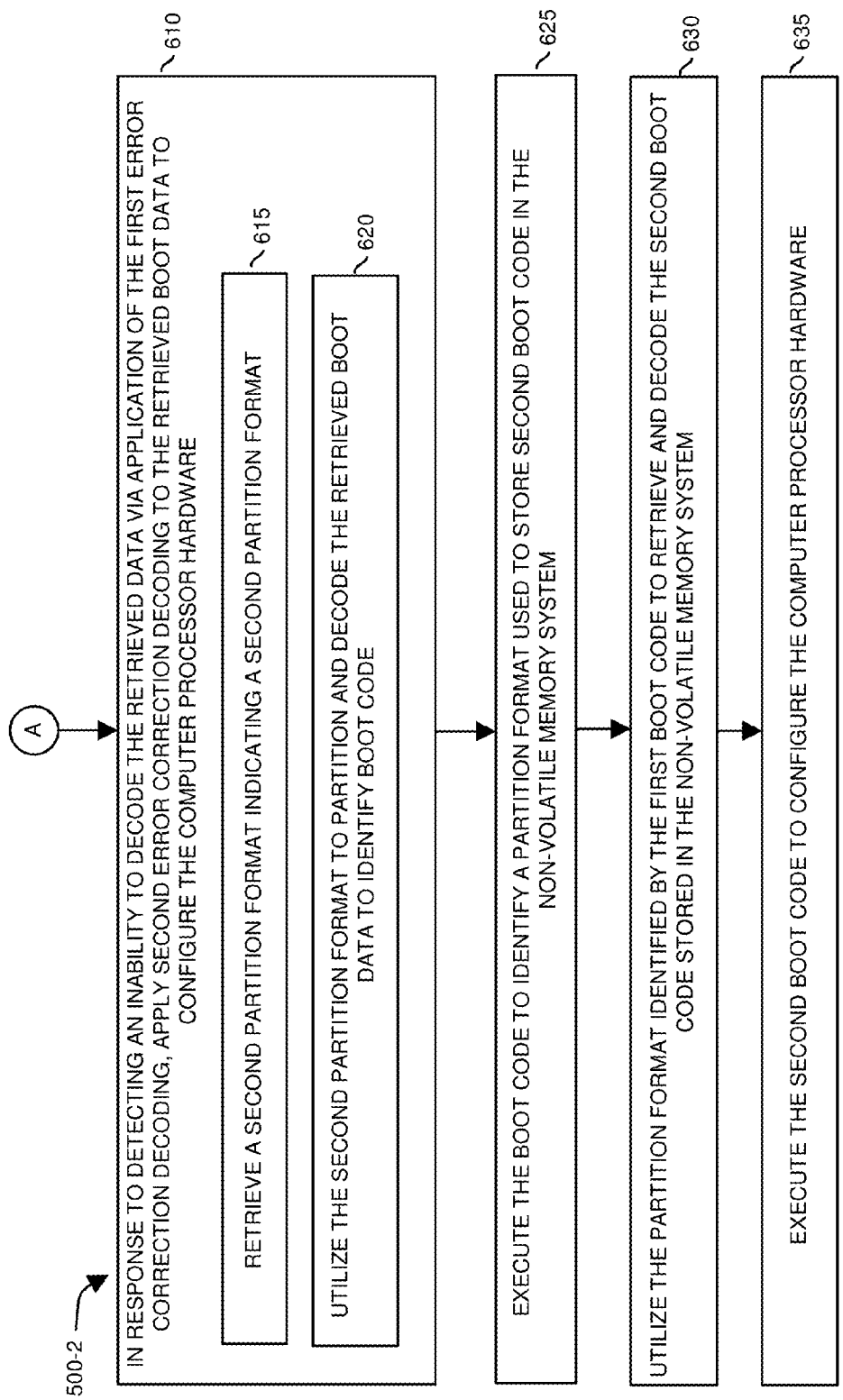

More specifically, FIGS. 5 and 6 combine to form a flowchart 500 (flowchart 500-1 and flowchart 500-2) illustrating an example method according to embodiments. Note that there will be some overlap with respect to concepts as discussed above.

In processing operation 510, the computer processor hardware 135 initiates retrieval of first boot data 170-1 stored in a non-volatile memory device 110-1 to configure computer processor hardware 135.

In processing operation 515, the computer processor hardware 135 applies first error correction decoding to the retrieved first boot data 170-1 to configure the computer processor hardware 135.

In sub-processing operation 520, the computer processor hardware 135 retrieves configuration information 145 stored in the non-volatile memory device 110-1.

In sub-processing operation 525, the computer processor hardware 135 processes the configuration information 145 to identify a first data-partitioning format 210 indicating first partitioning of segments of boot code 115-1 and segments of corresponding error correction information 116-1 stored in the boot data 170-1.

In sub-processing operation 530, the computer processor hardware 135 initiates decoding of the retrieved boot data 170-1 in accordance with the first data-partitioning format 210.

In processing operation 535, the computer processor hardware 135 detects an inability to decode the retrieved boot data 170-1 (into boot code 115-1 for execution by processor resource 160) via application of the first error correction decoding using the first data-partitioning format 210.

In sub-processing operation 540, the computer processor hardware 135 detects a number of errors associated with first error correction decoding above a threshold value because the applied first data-partitioning format 210 was not the same data-partitioning format used to originally store the boot data 170-1 in the non-volatile memory device 110-1.

Processing flow continues in flowchart 500-2 in FIG. 6.

In processing operation 610, in response to detecting an inability to decode the retrieved boot data 170-1 via application of the first error correction decoding, the computer processor hardware 135 applies second error correction decoding to the retrieved boot data 170-1 to configure the computer processor hardware 135.

In sub-processing operation 615, the computer processor hardware 135 obtains or identifies a second data-partitioning format 310 (such as a default data-partitioning format).

In sub-processing operation 620, the computer processor hardware 135 utilizes the second data-partitioning format 310 to partition and decode the retrieved boot data 170-1 to identify boot code 115-1 for execution by the processor resource 160.

Assuming that decoding of the boot data 170-1 using the second data-partitioning format 310 was successful to produce boot code 115-1, in processing operation 625, the computer processor hardware 135 executes the boot code 115-1 to identify a partition format used to store the second boot code 115-2 and corresponding error correction information 116-2 in the non-volatile memory system 118.

In processing operation 630, the computer processor hardware 135 utilizes the data-partitioning format identified by the first boot code 115-1 to retrieve and decode the second boot code 115-2 and error correction information 116-2 from boot data 170-2 stored in the non-volatile memory device 110-1.

In processing operation 635, the computer processor hardware 135 executes the second boot code 115-2 to further boot (configure) the computer processor hardware 135.

Figure 7:
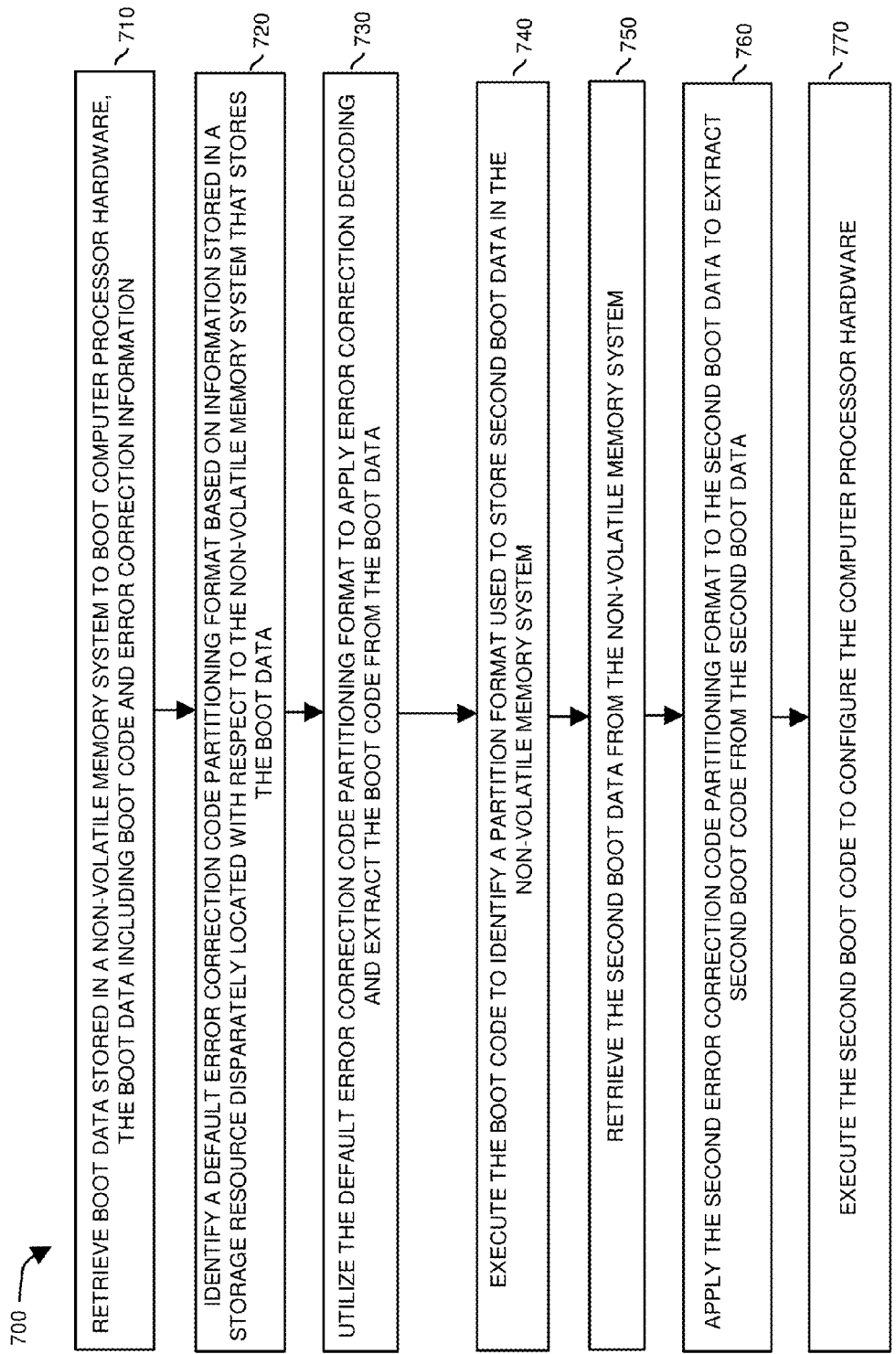
FIG. 7 is an example flowchart illustrating a method of configuring computer processor hardware according to embodiments herein.

FIG. 7 is a flowchart 700 illustrating an example method according to embodiments. Note that there will be some overlap with respect to concepts as discussed above.

In processing operation 710, the computer processor hardware 135 retrieves boot data 170-1 stored in a non-volatile memory device 110-1 to boot computer processor hardware 135. The boot data 170-1 includes boot code 115-1 and error correction information 116-1.

In processing operation 720, the computer processor hardware 135 identifies or selects a default data-partitioning format based on information (such as settings) stored in a storage resource disparately located with respect to the non-volatile memory device 110-1 that stores the boot data 115-1. In one embodiment, the processor resource 160 in computer processor hardware utilizes the boot application 140 stored in the non-volatile storage resource 125 to identify the default data-partitioning format 310.

In processing operation 730, the computer processor hardware 135 utilizes the default data-partitioning format to apply error correction decoding and extract the boot code 115-1 from the boot data 170-1. In one embodiment, the processor resource 160 executing the boot application 140 uses the default data-partitioning format 310 to configure the error correction decoder 150 for properly error decoding the boot data 170-1.

In processing operation 740, the computer processor hardware 135 executes the boot code 115-1 to identify a partition format used to store second boot data 170-2 in the non-volatile memory device 110-1.

In processing operation 750, the computer processor hardware 135 retrieves the second boot data 170-2 from the non-volatile memory device 110-1.

In processing operation 760, the computer processor hardware 135 applies the second data-partitioning format to the boot data 170-2 to extract second boot code 115-2 from the second boot data 170-2.

In processing operation 770, the computer processor hardware 135 executes the second boot code 115-2 to further boot the computer processor hardware 135.

Figure 8:
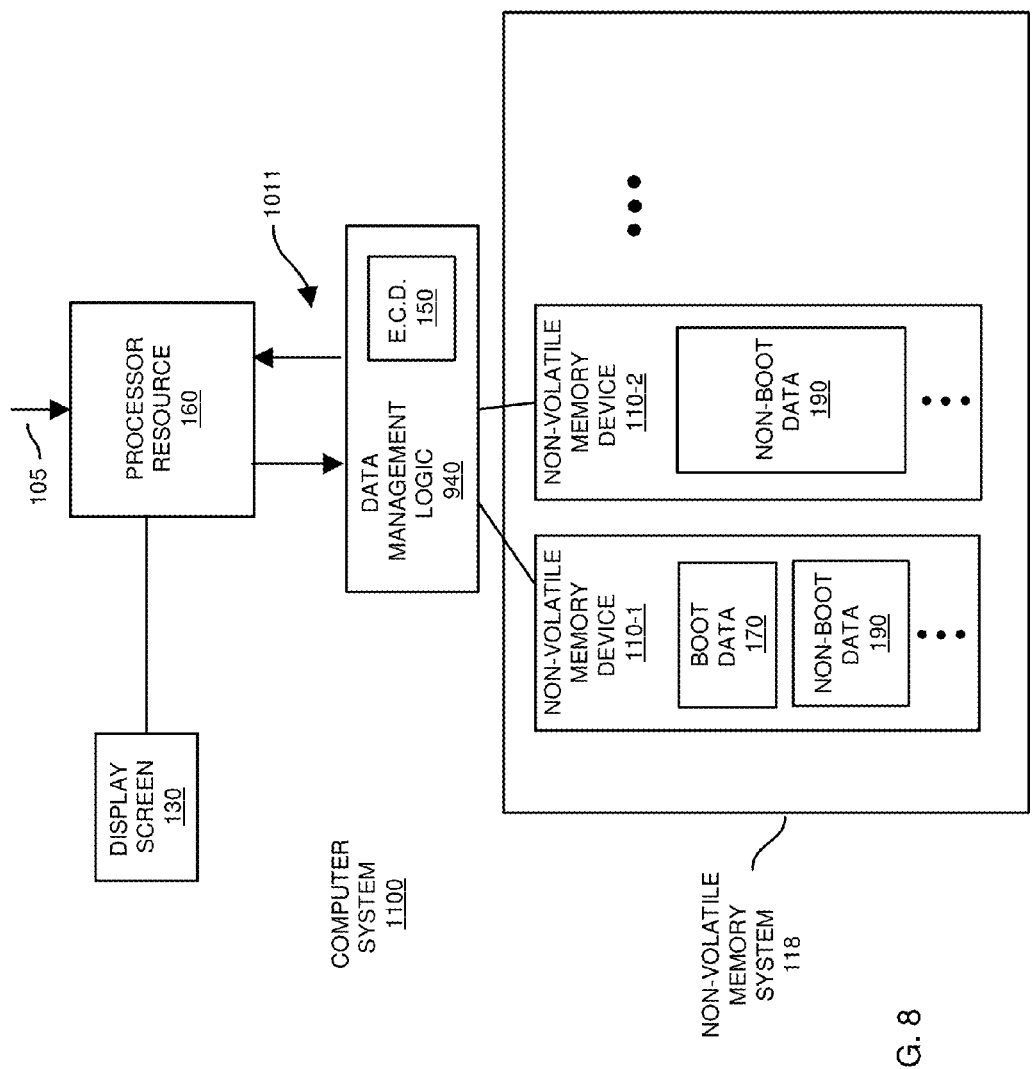
FIG. 8 is an example diagram illustrating a computer system according to embodiments herein.

FIG. 8 is an example diagram illustrating use of a non-volatile memory system in a respective computer system according to embodiments herein.

As shown, computer system 1100 can include processor resource 160 and a non-volatile memory system 118 to store data. In one embodiment, processor resource 160 is computer processor hardware including one or more processor devices. Computer system 1100 can be any suitable type of resource such as a personal computer, mobile computer, tablet, cellular phone, mobile device, camera, etc., using non-volatile memory system 1100 to store data.

By way of a non-limiting example, memory system 118 can be a solid-state drive used to store data.

In one embodiment, processor resource 160 has access to non-volatile memory system 118 via interface 1011. Interface 1011 can be any suitable link enabling data transfers. For example, the interface 1011 can be a SCSI (Small Computer System Interface), SAS (Serial Attached SCSI), SATA (Serial Advanced Technology Attachment), USB (Universal Serial Bus), PCIE (Peripheral Component Interconnect Express) bus, etc.

Via interface 1011, the host processor resource 160 of computer system 1100 is able to retrieve data from and store data in non-volatile memory system 110.

As an example, assume that input 105 is a command for the host processor resource 160 to retrieve data from non-volatile memory system 118. The host processor resource 160 performs the respective function (data retrieval) as specified by input 105 from a user. To achieve this end, the host processor resource 160 transmits a request over interface 1011 to data management logic 940 for retrieval of data at a specified logical address. The data management logic 940 maps the logical address to an appropriate physical address and retrieves the data from non-volatile memory system 118. Data management logic 940 transmits the retrieved data to host processor resource 160.

In one non-limiting example embodiment, the host processor resource 160 initiates display of an image on display screen 130 in accordance with the data received from the data management logic 940.

As a further example, input 105 can specify to store data in non-volatile memory system 118. In such an instance, the host processor resource 160 receives the request and communicates with data management logic 940 to store data at a logical address as specified by the host processor resource 160. In response to receiving the request, the domain management 940 initiates storage of the data in an appropriate physical address of non-volatile memory system 118. Thus, subsequent to booting (configuring), the computer system 1100 can be used to access data stored in the non-volatile memory system 118.

Note that no element, operation, or instruction employed herein should be construed as critical or essential to the application unless explicitly described as such. Also, as employed herein, the article "a" is intended to include one or more items. Where only one item is intended, the term "one" or similar language is employed. Further, the phrase "based on" is intended to mean "based, at least in part, on" unless explicitly stated otherwise.

While details have been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the embodiments herein are presented in the following claims.

The invention claimed is:

1. An apparatus comprising:
a non-volatile memory device to store boot data; and
computer processor hardware configured to:
initiate retrieval of the boot data stored in the non-volatile memory device;
apply first error correction decoding to all the retrieved boot data; and
in response to detecting an inability to decode all the retrieved boot data via application of the first error correction decoding, apply second error correction decoding to all the retrieved boot data to configure the computer processor hardware.

2. The apparatus as in claim 1, wherein the computer processor hardware is further configured to:
retrieve configuration information stored in the non-volatile memory device;
process the configuration information to identify a first data-partitioning format indicating first partitioning of boot code and corresponding error correction information stored in the retrieved boot data; and
initiate first error correction decoding of the retrieved boot data in accordance with the first partition format.

3. The apparatus as in claim 2, wherein the computer processor hardware is further configured to:
detect a number of errors associated with first error correction decoding that are above a threshold value.

4. The apparatus as in claim 2, wherein the computer processor hardware is further configured to:
select a second data-partitioning format indicating a second partition format; and
utilize the second data-partitioning format to partition and second error correction decode the retrieved boot data to obtain the boot code from the boot data.

5. The apparatus as in claim 4, wherein the boot code is first boot code; and wherein the computer processor hardware is further configured to:
execute the first boot code to identify a data-partitioning format used to store second boot code in the non-volatile memory device;
utilize the data-partitioning format identified by the first boot code to retrieve and second error correction decode the second boot code stored in the non-volatile memory device; and
execute the second boot code to configure the computer processor hardware.

6. The apparatus as in claim 1, wherein the computer processor hardware is further configured to:
identify a second data-partitioning format from setting information stored in a storage resource disparately located with respect to the non-volatile memory device, the second data-partitioning format used to perform the second error correction decoding.

7. The apparatus as in claim 6, wherein the storage resource is on-chip storage of the computer processor hardware.

8. The apparatus as in claim 1, wherein the computer processor hardware is further configured to:
identify a first data-partitioning format from configuration information stored in the non-volatile memory device, the first data-partitioning format used to perform the first error correction decoding; and
identify a second data-partitioning format from configuration information stored in a storage resource disparately located with respect to the non-volatile memory device, the second data-partitioning format used to perform the second error correction decoding.

9. A computer system including the apparatus as in claim 1, the computer system comprising:
a display screen on which to render an image based on display data retrieved from a non-volatile memory system including the non-volatile memory device.

10. A method comprising:
retrieving boot data stored in a non-volatile memory device to configure computer processor hardware, the boot data including boot code and error correction information;
identifying a default data-partitioning format based on setting information stored in a storage resource disparately located with respect to the non-volatile memory device that stores the boot data; and
utilizing the default data-partitioning format to apply error correction decoding and extract the boot code from all the boot data.

11. The method as in claim 10 further comprising:
executing the boot code extracted from the retrieved boot data to configure the computer processor hardware.

12. The method as in claim 10, wherein the boot data is first boot data;
wherein the boot code is first boot code, the method further comprising:
executing the first boot code to identify a data-partitioning format used to store second boot data in the non-volatile memory device;
retrieving the second boot data from the non-volatile memory device;
applying the second error data-partitioning format to the second boot data to extract second boot code from the second boot data; and
executing the second boot code to configure the computer processor hardware.

13. A method comprising:
retrieving boot data stored in a non-volatile memory system to configure computer processor hardware;
applying first error correction decoding to all the retrieved boot data; and
in response to detecting an inability to decode all the retrieved boot data via application of the first error correction decoding, applying second error correction decoding to all the retrieved boot data to configure the computer processor hardware.

14. The method as in claim 13, wherein applying the first error correction decoding includes:
retrieving configuration information stored in the non-volatile memory system;
processing the configuration information to identify a first data-partitioning format indicating first partitioning of boot code and corresponding error correction information stored in all the retrieved boot data; and
initiating first error correction decoding of the retrieved boot data in accordance with the first partition format.

15. The method as in claim 14, wherein detecting the inability of the first error correction decoding to decode the retrieved data includes:
detecting a number of errors associated with first error correction decoding above a threshold value.

16. The method as in claim 14, wherein applying the second error correction decoding to the retrieved boot data to configure the computer processor hardware includes:
retrieving a second data-partitioning format indicating a second partition format; and
utilizing the second data-partitioning format to partition and second error correction decode the retrieved boot data to identify boot code.

17. The method as in claim 16, wherein the boot code is first boot code, the method further comprising:
executing the first boot code to identify a data-partitioning format used to store second boot code in the non-volatile memory system;
utilizing the data-partitioning format identified by the first boot code to retrieve and second error correction decode the second boot code stored in the non-volatile memory system; and
executing the second boot code to configure the computer processor hardware.

18. The method as in claim 13, wherein applying first error correction decoding includes:
identifying a first error data-partitioning format from configuration information stored in the non-volatile memory system, the non-volatile memory system disparately located with respect to the computer processor hardware.

19. The method as in claim 18, wherein applying second error correction decoding includes:
identifying a second error correction code partitioning format from default settings as specified by settings information stored in a storage resource disparately located with respect to the non-volatile memory system that stores the boot data.

20. Non-transitory computer-readable storage hardware having instructions stored thereon, the instructions, when carried out by computer processor hardware, cause the computer processor hardware to perform operations of:
retrieving boot data stored in a non-volatile memory system to configure computer processor hardware;
applying first error correction decoding to all the retrieved boot data; and
in response to detecting an inability to decode all the retrieved data via application of the first error correction decoding, applying second error correction decoding to all the retrieved boot data to configure the computer processor hardware.

21. The non-transitory computer-readable storage hardware as in claim 20, wherein the instructions further cause the computer processor hardware to perform operations of:
retrieving configuration information stored in the non-volatile memory system;
processing the configuration information to identify a first data-partitioning format indicating first partitioning of retrieved boot code and corresponding error correction information stored in the retrieved boot data; and
initiating first error correction decoding of the retrieved boot data in accordance with the first partition format.

22. The non-transitory computer-readable storage hardware as in claim 21, wherein the instructions further cause the computer processor hardware to perform operations of:
detect a number of errors associated with first error correction decoding that are above a threshold value.

23. The non-transitory computer-readable storage hardware as in claim 21, wherein the instructions further cause the computer processor hardware to perform operations of:
retrieve a second data-partitioning format indicating a second partition format; and
utilize the second data-partitioning format to partition and second error correction decode the retrieved boot data to identify boot code.

* * * * *